(12) United States Patent
Gunnam et al.

(10) Patent No.: US 11,906,626 B2
(45) Date of Patent: Feb. 20, 2024

(54) SYSTEMS AND METHODS FOR MITIGATING AVALANCHE PHOTODIODE (APD) BLINDING

(71) Applicant: VELODYNE LIDAR USA, INC., San Jose, CA (US)

(72) Inventors: Kiran Kumar Gunnam, Santa Clara, CA (US); Nitinkumar Sagarbhai Barot, San Jose, CA (US); Rajesh Ramalingam Varadharajan, San Jose, CA (US); Roger Jullian Pinto, Alameda, CA (US); Kanke Gao, Fremont, CA (US)

(73) Assignee: Velodyne Lidar USA, Inc., San Jose, CA (US)

( * ) Notice: Subject to any disclaimer, the term of this patent is extended or adjusted under 35 U.S.C. 154(b) by 356 days.

(21) Appl. No.: 17/017,467

(22) Filed: Sep. 10, 2020

(65) Prior Publication Data

US 2021/0231809 A1    Jul. 29, 2021

Related U.S. Application Data

(63) Continuation of application No. 15/898,132, filed on Feb. 15, 2018, now Pat. No. 10,775,486.

(51) Int. Cl.
*G01S 7/4863* (2020.01)
*G01S 17/10* (2020.01)
(Continued)

(52) U.S. Cl.
CPC ............ *G01S 17/89* (2013.01); *G01S 7/4816* (2013.01); *G01S 7/4861* (2013.01);
(Continued)

(58) Field of Classification Search
None
See application file for complete search history.

(56) References Cited

U.S. PATENT DOCUMENTS 9,246,041 B1   1/2016   Clausen et al.
9,958,545 B2   5/2018   Eichenholz
(Continued)

FOREIGN PATENT DOCUMENTS

BY          10468 C1    4/2008
CN      105043539 A    11/2015
(Continued)

OTHER PUBLICATIONS

Hollinger et al. "Resolving ranges of layered objects using ground vehicle LiDAR", Proceedings vol. 9494, Next-Generation Robotics II; and Machine Intelligence and Bio-inspired Computation: Theory and Applicantions IX; 94940D (2015).*

(Continued)

*Primary Examiner* — Eric L Bolda
(74) *Attorney, Agent, or Firm* — Kilpatrick Townsend & Stockton LLP

(57) ABSTRACT

Described herein are systems and methods that that mitigate avalanche photodiode (APD) blinding and allow for improved accuracy in the detection of a multi-return light signal. A blinding spot may occur due to saturation of a primary APD. The systems and methods include the incorporation of a redundant APD and the utilization of time diversity and space diversity. Detection by the APDs is activated by a bias signal. The redundant APD receives a time delayed bias signal compared to the primary APD. Additionally, the redundant APD is positioned off the main focal plane in order to attenuate an output of the redundant APD. With attenuation, the redundant APD may not saturate and may have a successful detection during the blinding spot (Continued)

of the primary APD. Embodiments may include multiple primary APDs and multiple secondary APDs.

22 Claims, 10 Drawing Sheets

(51) Int. Cl.
*G01S 7/4861* (2020.01)
*G01S 7/481* (2006.01)
*H01L 31/16* (2006.01)
*H01L 31/107* (2006.01)
*G01S 17/931* (2020.01)
*G01S 17/89* (2020.01)
*G01S 17/42* (2006.01)
*H01L 31/02* (2006.01)

(52) U.S. Cl.
CPC ............ *G01S 7/4863* (2013.01); *G01S 17/10* (2013.01); *G01S 17/42* (2013.01); *G01S 17/931* (2020.01); *H01L 31/02019* (2013.01); *H01L 31/107* (2013.01); *H01L 31/165* (2013.01)

(56) References Cited

U.S. PATENT DOCUMENTS

| | | |
|---|---|---|
| 10,775,486 B2 | 9/2020 | Gunnam et al. |
| 11,187,802 B2 | 11/2021 | Pacala et al. |
| 2007/0058038 A1 | 3/2007 | David |
| 2011/0216304 A1 | 9/2011 | Hall |
| 2012/0075615 A1 | 3/2012 | Niclass et al. |
| 2016/0011312 A1 | 1/2016 | Leyva |
| 2016/0259038 A1 | 9/2016 | Retterath et al. |
| 2016/0266253 A1 | 9/2016 | Kubota |
| 2017/0153319 A1 | 6/2017 | Villeneuve |
| 2017/0299721 A1 | 10/2017 | Eichenholz et al. |
| 2017/0301716 A1 | 10/2017 | Irish |
| 2018/0348348 A1 | 12/2018 | Holleczek |
| 2019/0049582 A1 | 2/2019 | Hayashi et al. |
| 2019/0326347 A1* | 10/2019 | Bulteel .................. G01S 7/487 |
| 2020/0018832 A1 | 1/2020 | Azuma |
| 2021/0116550 A1* | 4/2021 | Entwistle .............. G01S 7/4865 |

FOREIGN PATENT DOCUMENTS

| | | | |
|---|---|---|---|
| CN | 105606232 | A | 5/2016 |
| CN | 106130722 | A | 11/2016 |
| CN | 107271055 | A | 10/2017 |
| JP | 2004247948 | A | 9/2004 |
| JP | 2007288522 | A | 11/2007 |
| JP | 2008020203 | A | 1/2008 |
| JP | 2012202776 | A | 10/2012 |
| JP | 2012530917 | A | 12/2012 |
| JP | 2014081253 | A | 5/2014 |
| JP | 2014081254 | A | 5/2014 |
| JP | 2014142340 | A | 8/2014 |
| JP | 2017108380 | A | 6/2017 |
| RU | 2597668 | C1 | 9/2016 |
| SU | 1429047 | A1 | 10/1988 |
| WO | 2017138155 | A1 | 8/2017 |
| WO | WO-2017138155 | A1 | 8/2017 |

OTHER PUBLICATIONS

Written Opinion of the International Searching Authority, dated Apr. 26, 2019, in International Patent Application PCT/US2019/16259, 5 pages.
International Search Report, dated Apr. 26, 2019, in International Patent Application PCT/US2019/16259, 2 pages.
JP2020-543296, "Notice of Decision to Grant", dated Aug. 15, 2023, 5 pages.
Extended European Search Report, dated Aug. 4, 2021, in European Patent Application 19754172.5.
Office Action and Search Report, dated Oct. 26, 2021, in Russian Patent Application No. 2020130045.
CN201980013542.3, "Office Action", dated Sep. 6, 2023, 30 pages.

* cited by examiner

For LiDAR the light source is a laser

Single emitter/detector pair rotating mirror lidar design

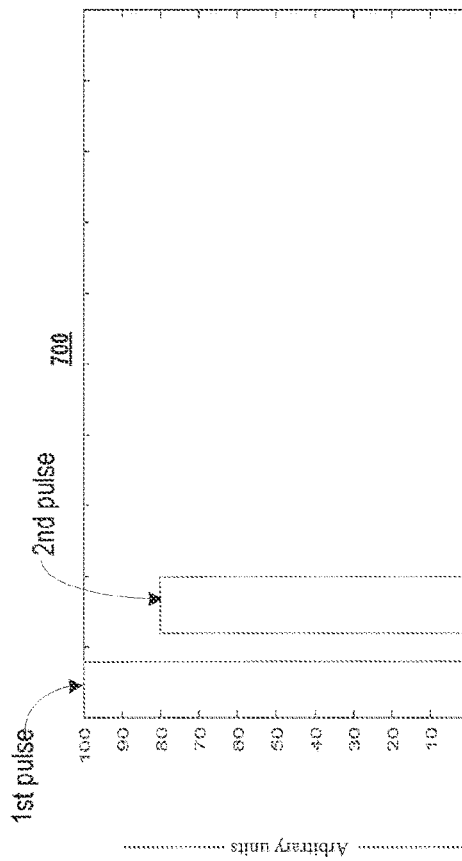
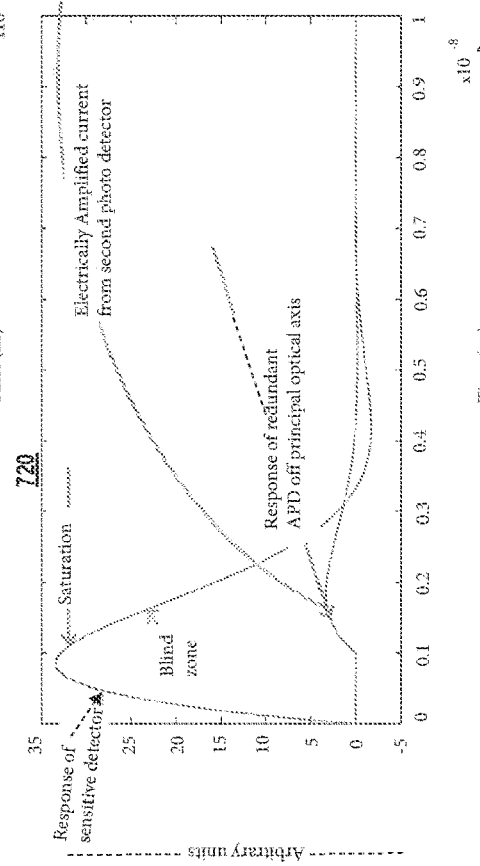
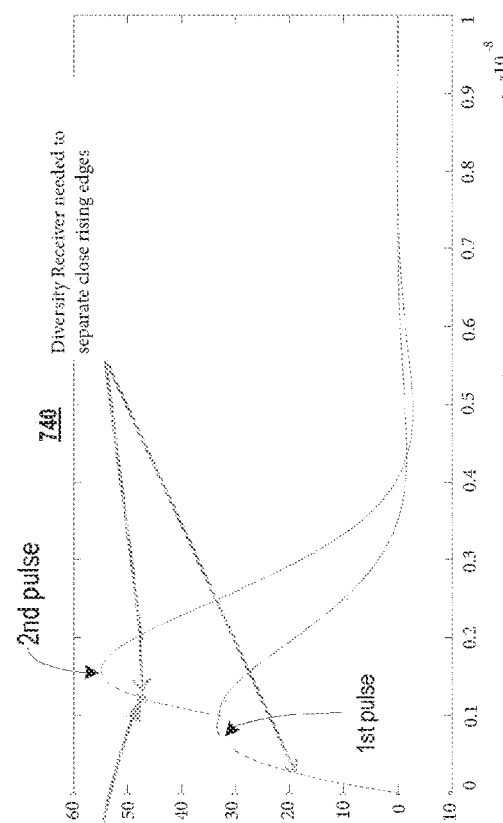
FIG. 7A
FIG. 7B
FIG. 7C

SYSTEMS AND METHODS FOR MITIGATING AVALANCHE PHOTODIODE (APD) BLINDING

CROSS-REFERENCE TO RELATED APPLICATIONS

This application is a continuation of U.S. patent application Ser. No. 15/898,132, filed Feb. 15, 2018, which is hereby incorporated by reference herein in its entirety.

BACKGROUND

A. Technical Field

The present disclosure relates generally to systems and methods for avalanche photodiode (APD), and more particularly for APDs utilized in light detection applications such a light detection and ranging system (LIDAR).

B. Background

In a light detection and ranging system, such as a LIDAR system, multiple peaks in a return signal may be received in close time proximity of one another. Since the photodiodes of the LIDAR systems may saturate and exhibit reverse bias avalanche recovery phenomena, a blinding spot may occur in the APD detection. The blinding spot may limit the ability of the LIDAR system to detect peaks in the multi-return light signal. In this situation the APD may be insensitive to light and unable to detect a peak in the multi-return light signal until the APD has recovered from saturation.

Accordingly, what is needed are systems and methods that mitigate APD blinding and allow for accurate detection of multi-return light signals.

BRIEF DESCRIPTION OF THE DRAWINGS

References will be made to embodiments of the invention, examples of which may be illustrated in the accompanying figures. These figures are intended to be illustrative, not limiting. Although the invention is generally described in the context of these embodiments, it should be understood that it is not intended to limit the scope of the invention to these particular embodiments. Items in the figures are not to scale.

FIGS. 7A, 7B, 7C graphically illustrates waveforms for the operation of the light detector with a redundant APD according to embodiments of the present document.

DETAILED DESCRIPTION OF EMBODIMENTS

Figure 1:
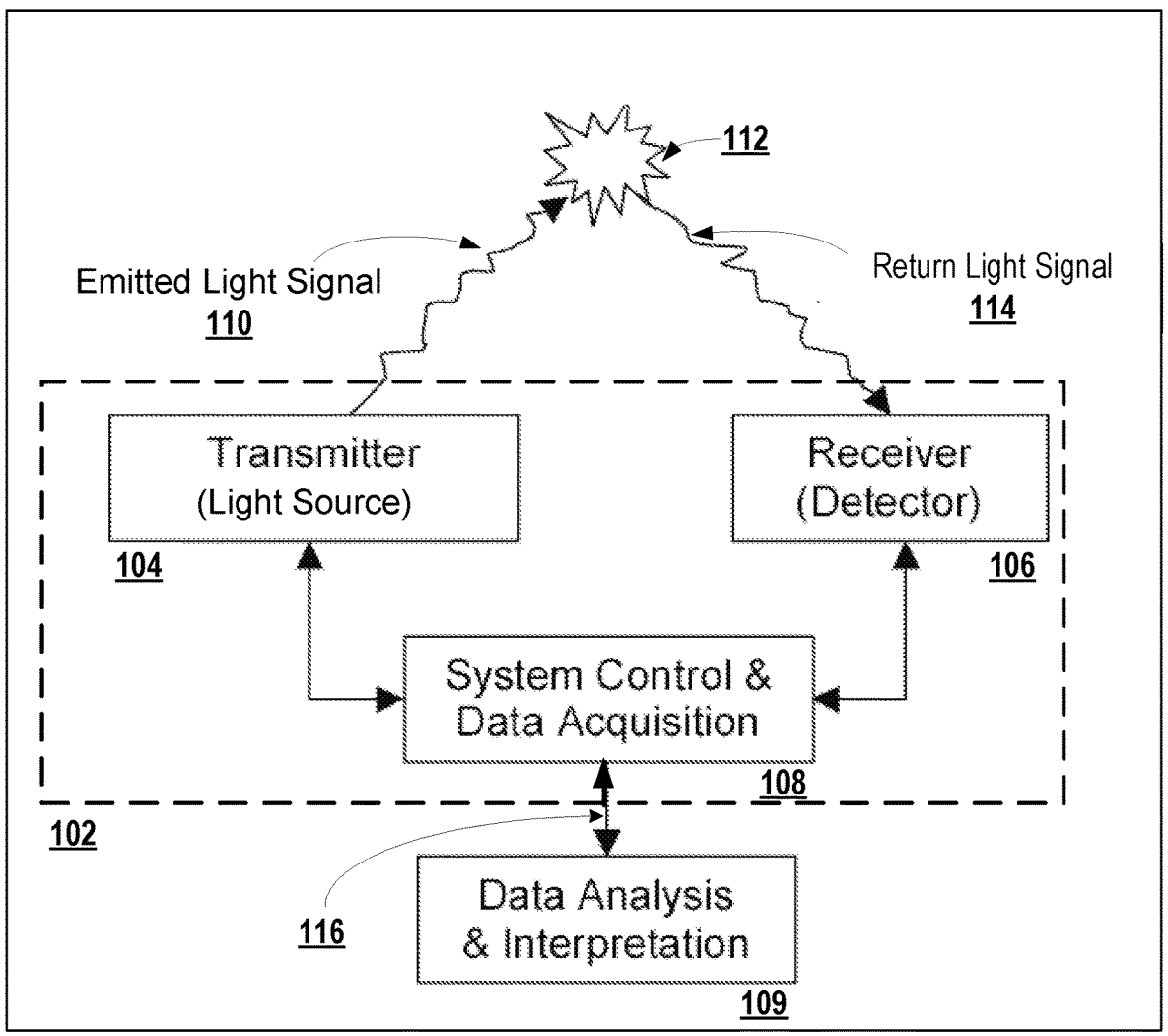
FIG. 1 depicts the operation of a light detection and ranging system according to embodiments of the present document.

In the following description, for purposes of explanation, specific details are set forth in order to provide an understanding of the invention. It will be apparent, however, to one skilled in the art that the invention can be practiced without these details. Furthermore, one skilled in the art will recognize that embodiments of the present invention, described below, may be implemented in a variety of ways, such as a process, an apparatus, a system, a device, or a method on a tangible computer-readable medium.

Components, or modules, shown in diagrams are illustrative of exemplary embodiments of the invention and are meant to avoid obscuring the invention. It shall also be understood that throughout this discussion that components may be described as separate functional units, which may comprise sub-units, but those skilled in the art will recognize that various components, or portions thereof, may be divided into separate components or may be integrated together, including integrated within a single system or component. It should be noted that functions or operations discussed herein may be implemented as components. Components may be implemented in software, hardware, or a combination thereof.

Furthermore, connections between components or systems within the figures are not intended to be limited to direct connections. Rather, data between these components may be modified, re-formatted, or otherwise changed by intermediary components. Also, additional or fewer connections may be used. It shall also be noted that the terms "coupled," "connected," or "communicatively coupled" shall be understood to include direct connections, indirect connections through one or more intermediary devices, and wireless connections.

Reference in the specification to "one embodiment," "preferred embodiment," "an embodiment," or "embodiments" means that a particular feature, structure, characteristic, or function described in connection with the embodiment is included in at least one embodiment of the invention and may be in more than one embodiment. Also, the appearances of the above-noted phrases in various places in the specification are not necessarily all referring to the same embodiment or embodiments.

The use of certain terms in various places in the specification is for illustration and should not be construed as limiting. A service, function, or resource is not limited to a single service, function, or resource; usage of these terms may refer to a grouping of related services, functions, or resources, which may be distributed or aggregated.

The terms "include," "including," "comprise," and "comprising" shall be understood to be open terms and any lists the follow are examples and not meant to be limited to the listed items. Any headings used herein are for organizational purposes only and shall not be used to limit the scope of the description or the claims. Each reference mentioned in this patent document is incorporate by reference herein in its entirety.

Furthermore, one skilled in the art shall recognize that: (1) certain steps may optionally be performed; (2) steps may not be limited to the specific order set forth herein; (3) certain steps may be performed in different orders; and (4) certain steps may be done concurrently.

A. Light Detection and Ranging System

A light detection and ranging system, such as a LIDAR system, may be a tool to measure the shape and contour of the environment surrounding the system. LIDAR systems may be applied to numerous applications including both autonomous navigation and aerial mapping of a surface. LIDAR systems emit a light pulse that is subsequently reflected off an object within the environment in which a system operates. The object may be considered a "reflector" The time each pulse travels from being emitted to being received may be measured (i.e., time-of-flight "TOF") to determine the distance between the object and the LIDAR system. The science is based on the physics of light and optics.

In a LIDAR system, light may be emitted from a rapidly firing laser. Laser light travels through a medium and reflects off points of things in the environment like buildings, tree branches and vehicles. The reflected light energy returns to a LIDAR receiver (detector) where it is recorded and used to map the environment.

FIG. 1 depicts operation 100 of a light detection and ranging components 102 and data analysis & interpretation 109 according to embodiments of the present document. Light detection and ranging components 102 may comprise a transmitter 104 that transmits emitted light signal 110, receiver 106 comprising a detector, and system control and data acquisition 108. Emitted light signal 110 propagates through a medium and reflects off object 112. Return light signal 114 propagates through the medium and is received by receiver 106. System control and data acquisition 108 may control the light emission by transmitter 104 and the data acquisition may record the return light signal 114 detected by receiver 106. Data analysis & interpretation 109 may receive an output via connection 116 from system control and data acquisition 108 and perform data analysis functions. Connection 116 may be implemented with a contact or non-contact communication method. Transmitter 104 and receiver 106 may include an optical lens (not shown). Transmitter 104 may emit a laser beam having a plurality of pulses in a particular sequence. In some embodiments, light detection and ranging components 102 and data analysis & interpretation 109 comprise a LIDAR system.

Figure 2:
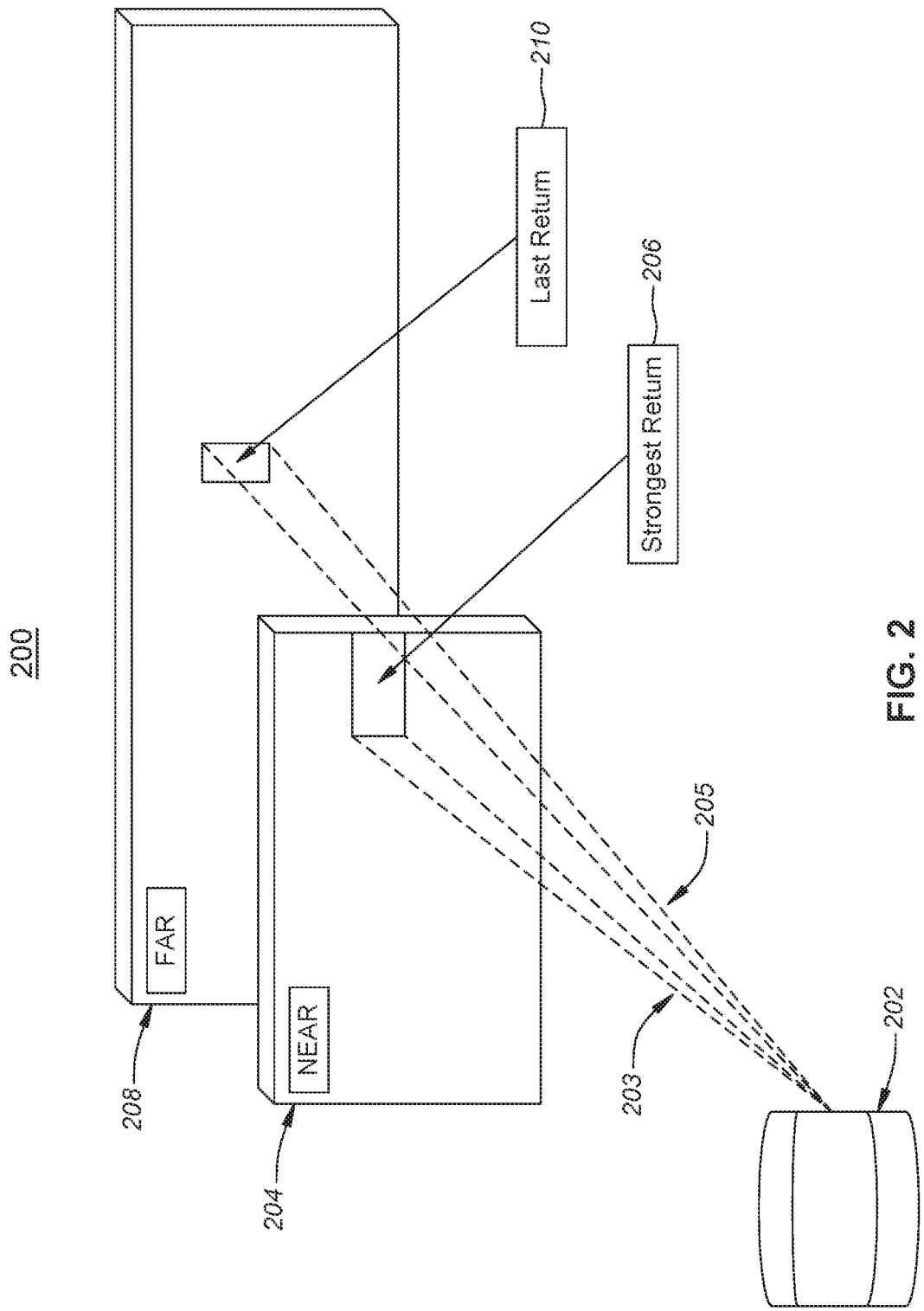
FIG. 2 illustrates the operation of a light detection and ranging system and multi-return light signals according to embodiments of the present document.

FIG. 2 illustrates the operation 200 of light detection and ranging system 202 including multi-return light signals: (1) return signal 203 and (2) return signal 205 according to embodiments of the present document. Light detection and ranging system 202 may be a LIDAR system. Due to the laser's beam divergence, a single laser firing often hits multiple objects producing multiple returns. The light detection and ranging system 202 may analyze multiple returns and may report either the strongest return, the last return, or both returns. Per FIG. 2, light detection and ranging system 202 emits a laser in the direction of near wall 204 and far wall 208. As illustrated, the majority of the beam hits the near wall 204 at area 206 resulting in return signal 203, and another portion of the beam hits the far wall 208 at area 210 resulting in return signal 205. Return signal 203 may have a shorter TOF and a stronger received signal strength compared with return signal 205. Light detection and ranging system 202 may record both returns only if the distance between the two objects is greater than minimum distance. In both single and multi-return LIDAR systems, it is important that the return signal is accurately associated with the transmitted light signal so that an accurate TOF is calculated.

Some embodiments of a LIDAR system may capture distance data in a 2-D (i.e. single plane) point cloud manner. These LIDAR systems may be often used in industrial applications and may be often repurposed for surveying, mapping, autonomous navigation, and other uses. Some embodiments of these devices rely on the use of a single laser emitter/detector pair combined with some type of moving mirror to effect scanning across at least one plane. This mirror not only reflects the emitted light from the diode, but may also reflect the return light to the detector. Use of a rotating mirror in this application may be a means to achieving 90-180-360 degrees of azimuth view while simplifying both the system design and manufacturability.

Figure 3:
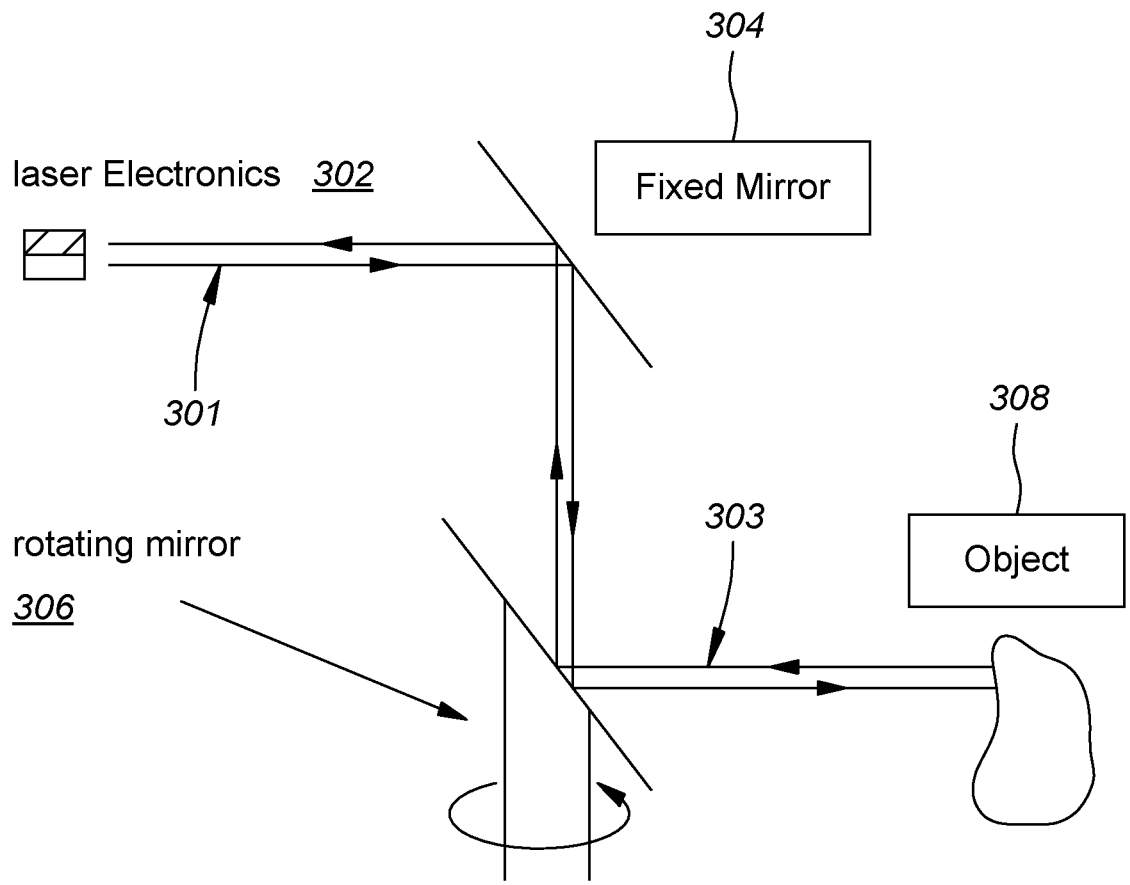
FIG. 3 depicts a LIDAR system with a rotating mirror according to embodiments of the present document.

FIG. 3 depicts a LIDAR system 300 with a rotating mirror according to embodiments of the present document. LIDAR system 300 employs a single laser emitter/detector combined with a rotating mirror to effectively scan across a plane. Distance measurements performed by such a system are effectively two-dimensional (i.e., planar), and the captured distance points are rendered as a 2-D (i.e., single plane) point cloud. In some embodiments, but without limitations, rotating mirrors are rotated at very fast speeds e.g., thousands of revolutions per minute. A rotating mirror may also be referred to as a spinning mirror.

LIDAR system 300 comprises laser electronics 302, which comprises a single light emitter and light detector. The emitted laser signal 301 may be directed to a fixed mirror 304, which reflects the emitted laser signal 301 to rotating mirror 306. As rotating mirror 306 "rotates", the emitted laser signal 301 may reflect off object 308 in its propagation path. The reflected signal 303 may be coupled to the detector in laser electronics 302 via the rotating mirror 306 and fixed mirror 304.

As previously noted, time of flight or TOF is the method a LIDAR system uses to map the environment and provides a viable and proven technique used for detecting target objects. Simultaneously, as the lasers fire, firmware within a LIDAR system may be analyzing and measuring the received data. The optical receiving lens within the LIDAR system acts like a telescope gathering fragments of light photons returning from the environment. The more lasers employed in a system, the more the information about the environment may be gathered. Single laser LIDAR systems may be at a disadvantage compared with systems with multiple lasers because fewer photons may be retrieved, thus less information may be acquired. Some embodiments, but without limitation, of LIDAR systems have been implemented with 8, 16, 32 and 64 lasers. Also, some LIDAR embodiments, but without limitation, may have a vertical field of view (FOV) of 30-40° with laser beam spacing as tight as 0.3° and may have rotational speeds of 5-20 rotations per second.

The rotating mirror functionality may also be implemented with a solid state technology such as MEMS.

B. Avalanche Photodiodes (APDs) in Multi-Return Light Signal Detectors

As discussed relative to FIG. 2, with a LIDAR system, one laser fire may hit multiple objects with a different distance in one line, causing multiple return signals to be received. Detecting multiple return light signals in these environments may be extremely challenging for a LIDAR system especially when an avalanche photodiode (APD) of the LIDAR system becomes saturated resulting in blinding spot and is unable to detect a peak in a multi-return signal. As used herein, a "peak" is equivalent to a "pulse" of a multi-return signal.

Figure 4A:
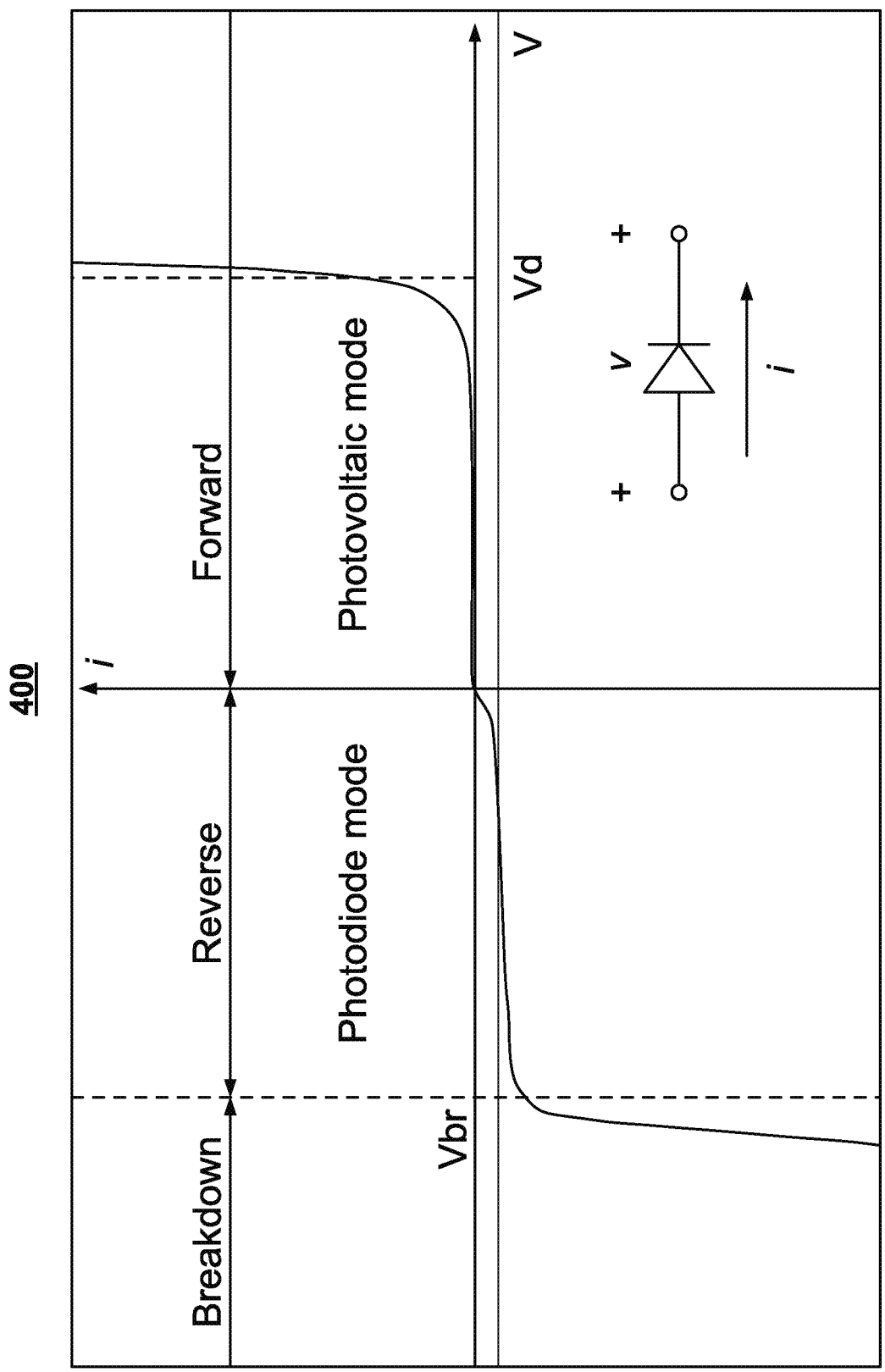
FIG. 4A graphically illustrates the current-voltage characteristics of a photodiode according to embodiments of the present document.

A photodiode is a semiconductor device that converts light into an electrical current. The current is generated when photons are absorbed in the photodiode. A small amount of current may also be produced when no light is present. FIG. 4A graphically illustrates the current-voltage (IV) 400 characteristics of a photodiode according to embodiments of the present document. When used in zero bias or photovoltaic mode, the flow of photocurrent out of the device is restricted and a voltage builds up. This mode exploits the photovoltaic effect, which is the basis for solar cells. The voltage Vd denotes the voltage that is typically considered an "on" state for the diode.

Of interest for embodiments of the present document is the operation in the photodiode mode, where the photodiode operates with a reverse bias. Per FIG. 4A, as the reverse bias voltage increases, the negative current, i, increases in an approximate linear manner until a breakdown voltage Vbr occurs. After breakdown, the negative current, i, may significantly increase as the photodiode saturates. The photodiode may then enter a reverse bias recovery mode. During the reverse bias recovery mode the photodiode may be insensitive to light; hence, there may be a blinding spot in the detection process.

Generally, the photodiode of a LIDAR sensor is an APD. Avalanche photodiodes are photodiodes with a structure optimized for operating with high reverse bias, approaching the reverse breakdown voltage. This structure allows each photo-generated carrier to be multiplied by avalanche breakdown, resulting in internal gain within the photodiode, which increases the effective responsivity of the device.

As previously noted, when the APD is in a reverse bias recovery mode, the photodiode may be insensitive to light. In this case, LIDAR system light detection may be prevented until the photodiode recovers to a reverse bias mode of operation. For example, laser-based night vision systems may not overcome the blinding effects associated with highly reflective objects. Many signs have highly reflective surfaces for reflection of incandescent light, such as that emitted from vehicle headlamps, for direct viewing ease by a vehicle operator. The signs are often covered with retro-reflective paint that can reflect a large amount of light and cause image saturation. A saturated image may be generally unclear and unreadable. Large flat surfaces, such as on trucks, buses, and vans, can also cause image saturation. When a bright light is close to a reflector, the return signal to the light detector may saturate the APD, causing a blinding spot. Detecting blinding spots may be especially important when detecting translucent objects, e.g., glass kiosks at street corners.

Figure 4B:
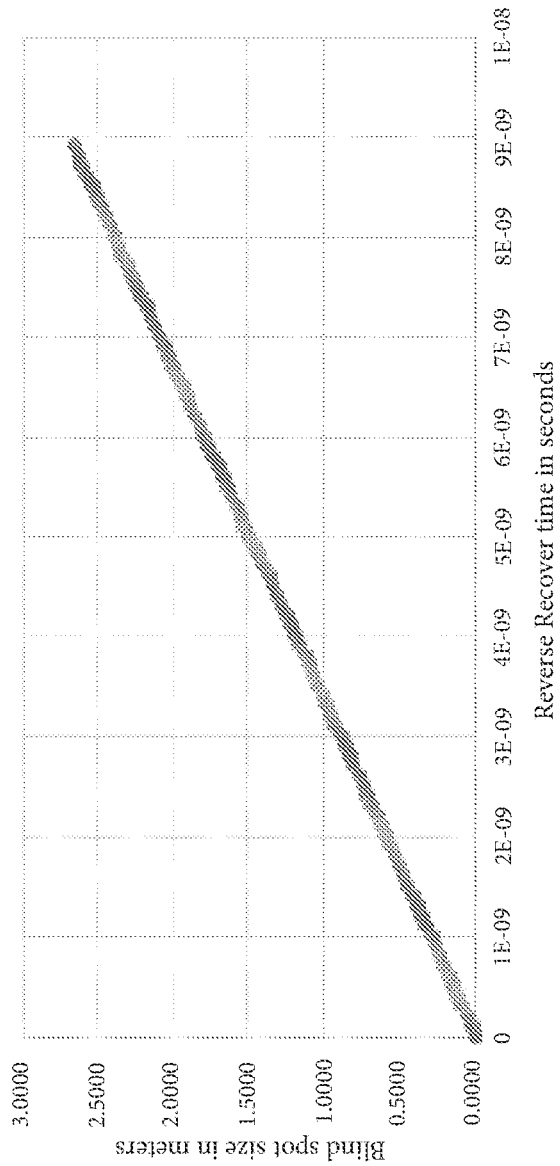
FIG. 4B graphically illustrates the size on a blinding spot according to embodiments of the present document.

In some embodiments, but without limitation, recovery time may be several nanoseconds, for example, but without limitation, 2-6 nanoseconds, which may cause a blinding spot of a few meters. FIG. 4B graphically illustrates the size on a blinding spot 450 according to embodiments of the present document. Specifically, FIG. 4B indicates the blind spot size in meters relative to the reverse recover time in seconds.

C. Mitigate Blinding Spots in APDs

Figure 5:
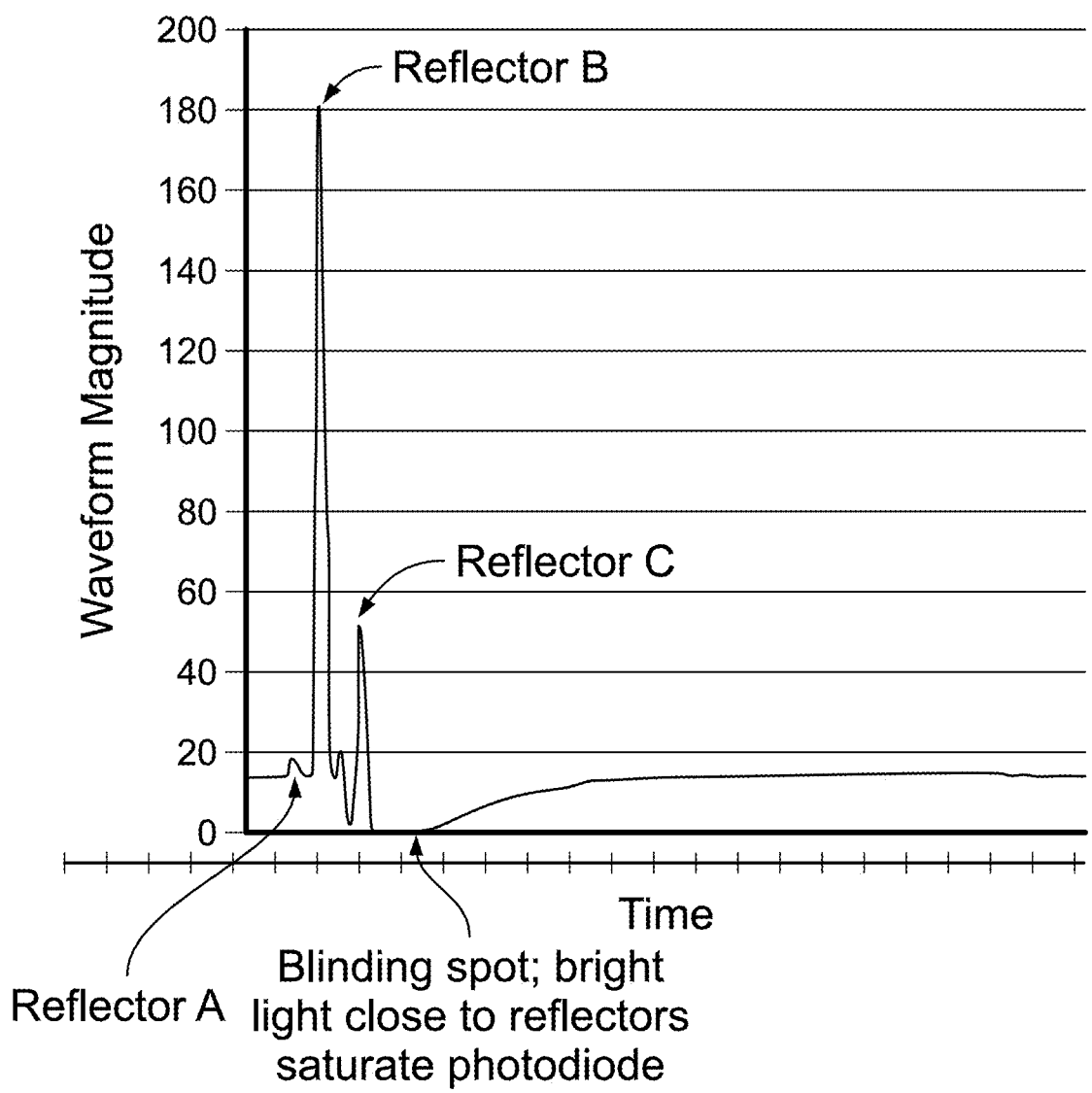
FIG. 5 graphically illustrates a detected multi-return light signal comprising a blinding spot according to embodiments of the present document.

FIG. 5 graphically illustrates a detected multi-return light signal 500 comprising a blinding spot according to embodiments of the present document. The light detection system utilized in the detection process may be a LIDAR system and the light detection system may perform detection with a single APD. Multi-return light signal 500 comprises a sequence of pulses and a blinding spot. As discussed, when a bright light is close to a reflector, the return signal to the light detector may saturate the APD, causing a blinding spot. This situation may compromise the accuracy of the LIDAR system, which may not be resolved via calibration. For example, a laser beam may be fired and reflected off several reflectors. As illustrated in FIG. 5, the multi-return light signal 500 comprises a sequence of three peak signals, as indicated by Reflector A, Reflector B and Reflector C. The magnitude of the peak signals may indicate distance and reflector information. FIG. 5 also comprises a blinding spot which may have been caused because a bright light may have had a close proximity to reflectors, causing saturation of the APD. A fourth peak may have been positioned immediately after Reflector C, but was not detected by the LIDAR system because of the blinding spot. Effectively, the fourth peak was "hidden peak". In some embodiments, the peak of Reflector C may overlap with the fourth peak. FIG. 5 illustrates performance challenges when decoding subsequent light pulses in the multi-return light signal 500 when a light detector utilizes a single APD for the decoding.

Embodiments of the present document propose the use of redundant APDs in a light detection system to improve the accuracy of detection. For example, there may be one redundant APD to support every simultaneous laser firing group. Current LIDAR systems may include multiple APDs with a firing control function that enables one APD at a time to perform detection. One embodiment of the present documents would configure one redundant APD to support the multiple APDs.

In implementing the redundant APD, space diversity may be utilized to minimize the probability of blinding. Space multiplexing may be implemented by positioning the redundant APD off the main optical plane, such that the redundant APD may receive less power than a primary APD which is positioned on the main optical plane. The primary APDs are "sensitive" APDs inasmuch as they may be positioned on the main focal plane so they are not attenuated and their operation is not restricted. Hence, the optical separation between the sensitive APDs and the redundant APD may allow for attenuating the received optical power in the redundant APD; thus the term, "attenuated redundant APD". An attenuated input may ensure that the attenuated redundant APD may not saturate when the sensitive APD becomes saturated. The "attenuated redundant APD" may be referred to as a secondary APD and the "sensitive APD" may be referred to as a primary APD.

Additionally, an embodiment of the present documents may improve the detection performance with the inclusion of time diversity. Time diversity may be achieved by delaying the bias signal to the redundant APD relative to the bias signal of the sensitive APD.

1. Light Detector with a Redundant APD

Figure 6:
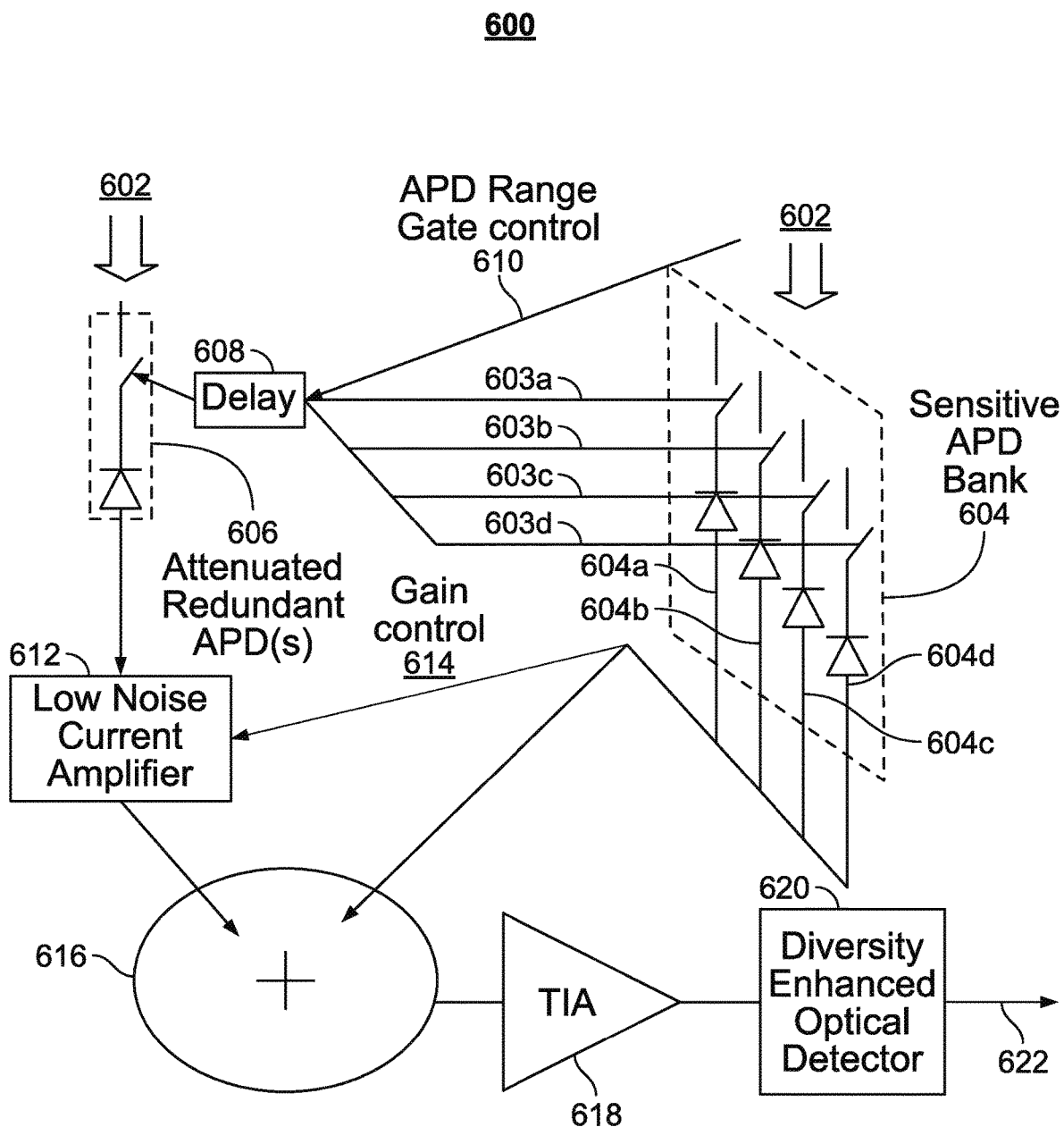
FIG. 6 depicts a light detector with a redundant APD according to embodiments of the present document.

FIG. 6 depicts a light detector 600 with a redundant APD according to embodiments of the present document. Light detector 600 may be utilized in a LIDAR system. Light detector 600 incorporates space diversity and time diversity functions and comprises four primary (sensitive) APDs and one secondary (redundant) APD. The secondary APD may operate with any one of the primary APDs. As described herein, light detector 600 may operates on a static or dynamic basis. One embodiment of static operation, the operation of the secondary APD and primary APDs may be pre-defined and may be independent of the characteristics of multi-return light signals.

A multi-return light signal may be received by a bank of primary APDs including sensitive APDs 604a, 604b, 604c and 604d, or sensitive APD bank 604. Sensitive APDs 604a, 604b, 604c and 604d may be activated by a controller based on a laser firing sequence. The controller may be APD range gate control 610, which is coupled to sensitive APDs 604*a*, 604*b*, 604*c* and 604*d* via signals 603*a*, 603*b*, 603*c* and 603*d*, respectively. APD range gate control 610 may also be coupled to delay 608. One skilled in the art will recognize that in other embodiments, a bank of sensitive APDs may comprise n number of APDs and may not be limited to four APDs. In some embodiments, the number n of primary APDs may vary between 16 and 128.

In one embodiment, attenuated redundant APD 606 may operate as a redundant APD to sensitive APD 604*a*. APD range gate control 610 activates sensitive APD 604*a* causing sensitive 604*a* to received multi-return light signal 602. The characteristics of multi-return light signal 602 may cause a blinding spot for sensitive APD 604*a* during the detection process. Simultaneously, APD range gate control 610 activates delay 608, causing attenuated redundant APD 606 to be activated with a time delay relative to the activation of sensitive APD 604*a*. This delayed bias gate for attenuated redundant APD 606 provides time diversity relative to sensitive APD 604*a* via delay 608. As the light detector 600 sequences through laser firing control, other APDs in sensitive APD bank 604 are selected, e.g. sensitive APDs 604*b*, 604*c* and 604*d*. As each of these other sensitive APDs is activated, attenuated redundant APD 606 operates in a redundant manner to support the selected sensitive APD.

Attenuated redundant APD 606 may be activated by APD range gate control 610 with time diversity relative to any of the APDs in the sensitive APD bank 604. Delay 608 may be turned on to allow for a time diversity factor between sensitive APD bank 604 and attenuated redundant APD 606. The delay step size may be a fraction of the laser width pulse. Time diversity may improve the accuracy of detection of multi-return light signals, as will be discussed relative to FIGS. 7A, 7B, 7C.

Space diversity may be implemented as follows. First, each of the APDs in the sensitive APD bank 604 may be located at a different optical plane from one another. Attenuated redundant APD 606 may be located at a different optical plane than the APDs in the sensitive APDs bank 604. The optical separation between the APDs in the sensitive APDs bank 604 and the redundant APD may allow for attenuating the received optical power in the redundant APD; hence the term, "attenuated redundant APD 606". Space diversity may be achieved via use of semi-transparent mirrors. For example, but without limitations, current mirrors may have 2% transmissive, so one can put the redundant APDs behind the current mirror, which may be a different optical plane.

The sensitive APD bank 604 may operate with attenuated redundant APD 606 to mitigate the possibility of APD blinding. Sensitive APD 604*a* may be activated and may detect a sequence of return signals. With time diversity (a delay) and space diversity, attenuated redundant APD 606 may be activated to support the detection of the sequence of return signals in light detector 600. Attenuated redundant APD 606 may detect a hidden pulse when sensitive APD 604*a* is saturated and has a blinding spot, which may negatively impact the detection capability of sensitive APD 604*a*.

The output of attenuated redundant APD 606 may be coupled to low noise current amplifier 612 to amplify its current. A controller activates gain control 614 utilizing inverting gain ratio control to manage the resulting outputs from attenuated redundant APD 606 and sensitive APD 604*a*. Each resulting output may have a different gain based on the inverting gain ratio control. The resulting outputs are coupled to combiner 616, which implements MIMO processing with maximum gain ratio combining maximum gain ratio combining. The output of combiner 616 is coupled to trans-impedance amplifier (TIA) 618. The output of trans-impedance amplifier 618 is coupled to diversity enhanced optical detector 620 that outputs the detected multi-return signal 622.

Combiner 616 may have undesirable noise due to the two parallel paths: one from low noise current amplifier 612 (based on attenuated redundant APD 606) and one from sensitive APD 604*a*. Dynamic weighting of the parallel paths may mitigate the impact of noise. For example, if the sensitive APD 604*a* current is below a threshold, the current based on attenuated redundant APD 606 may be de-weighted. If the sensitive APD 604*a* current is below a noise floor, the sensitive APD 604*a* current may be de-weighted. In a high noise environment, combiner 616 stops combining, and only monitors its inputs.

FIGS. 7A, 7B and 7C graphically illustrate waveforms 700, 720 and 740 for the operation of light detector 600 of FIG. 6 with a redundant APD according to embodiments of the present document. Specifically, FIGS. 7A, 7B and 7C graphically illustrate waveforms resulting from sensitive APD 604*a* and attenuated redundant APD 606. FIG. 7A illustrates two pulses of multi-return light signal 602 where first pulse is in close proximity to the second pulse. The pulses are represented as ideal rectangular pulses.

FIG. 7B illustrates a response or output of sensitive APD 604*a* and from attenuated redundant APD 606. During the generation of this output, sensitive APD 604*a* may become saturated resulting in a blinding spot (see blind zone). In other words, FIG. 7B illustrates the close in bright reflector saturating the sensitive APD 604*a*, i.e., the primary APD. During recovery from saturation, sensitive APD 604*a* may be unable to detect the second pulse. Typical saturation recovery may last for several nanoseconds (ns). Therefore, at ~30 cm/ns, 6 ns may result in a blinding spot of 2 meters.

FIG. 7B also illustrates the response or output of attenuated redundant APD 606 (i.e., response redundant APD), which is located off the principle optical axis of sensitive APD 604*a*. Therefore the "redundant APD" is attenuated. Per FIG. 7B, the magnitude of the "response of sensitive detector" is greater than the magnitude of the "response redundant APD".

The output of attenuated redundant APD 606 may be electrically amplified by low noise current amplifier 612, resulting in waveforms 740 of FIG. 7C. Waveform 740 shows the result of MIMO processing with Maximum Gain Ratio Combining to capture two events in close proximity.

Waveforms 740 comprise the response of sensitive APD 604*a* (the first pulse) and the amplified output of attenuated redundant APD 606 (the second pulse). Because of the amplification of low noise current amplifier 612, the pulse (second pulse) detected by the attenuated redundant APD 606 is now larger that the pulse (first pulse) detected by sensitive APD 604*a*. Waveform 740 may be decoded by a diversity receiver since waveform 740 includes close rising edges.

2. Method of Light Detection with a Redundant APD

Figure 8:
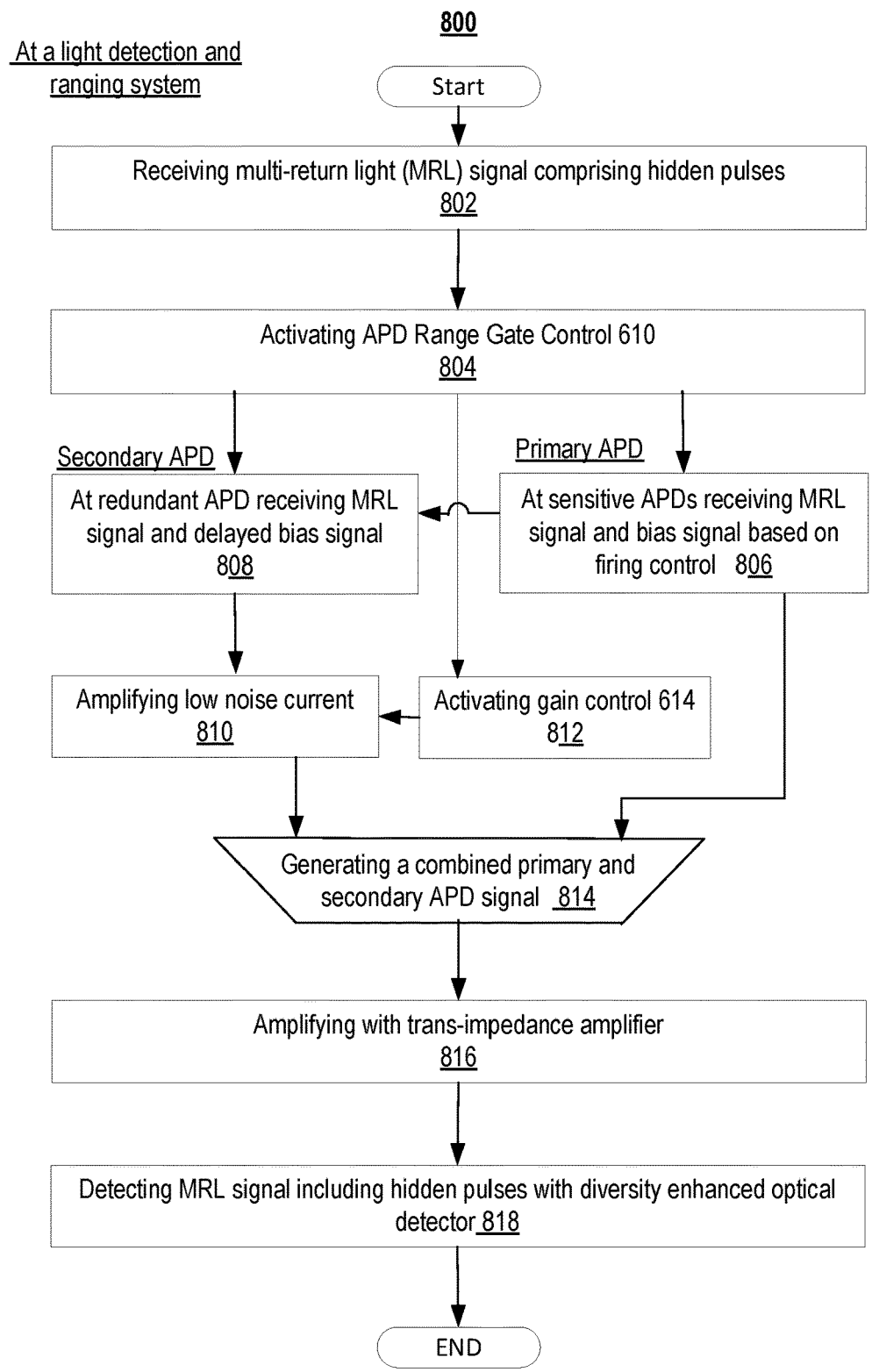
FIG. 8 depicts a flowchart for detecting multi-return light signals utilizing a light detector with a redundant APD according to embodiments of the present document.

A method of detecting a multi-return light signal by a light detection and ranging system, e.g., a LIDAR system is described. FIG. 8 depicts a flowchart 800 for detecting multi-return light signals utilizing a light detector with a redundant APD according to embodiments of the present document. More specifically, FIG. 8 describes a method of detecting a hidden pulse in a multi-return light signal where the first pulse causes saturation in the primary APD, resulting in a blinding spot. (See FIG. 7B.)

In the following steps, references are made to some elements of light detector 600. Also, in the following steps, the primary APD may be one of sensitive APD 604*abcd* and the secondary APD may be attenuated redundant APD 606. The steps of the method comprise:

Receiving a multi-return light (MRL) signal comprising pulses that may have close proximity to one another. The MRL signal may comprise a hidden pulse resulting from a close in bright reflector that may cause saturation of a primary APD (high gain detector) in light detector 600. (step 802)

Activating APD range gate control 610 to generate a bias signal. This action determines activation sequence of primary APDs and secondary APDs. Gain control 610 is activated. (step 804)

Receiving at a selected primary APD (high gain detector) the bias signal and the MRL signal. The primary APD may be selected from sensitive APD bank 604 based on firing control. Also, each APD in the sensitive APD bank 604 may be positioned at a different optical plane. The primary APD generates a trigger for the secondary APD. (step 806)

Receiving at a secondary APD the MRL signal and a delayed bias signal, wherein the bias signal is delayed by delay 608. The delayed bias signal may cause the secondary APD to detect in a delayed time window relative to the primary APD. The secondary (redundant) APD may be in a different optical plane than the primary APD causing the signal emitted from the secondary (redundant) APD to be "attenuated" relative to the signal emitted from the primary (sensitive) APD. (step 808)

Activating gain control 614 utilizing inverting gain ratio control to manage the resulting outputs from the secondary APD and the primary APD. (step 812)

Amplifying the output of the secondary APD with low noise current amplifier 612 based on gain control 614 of step 812. (step 810)

Combining the resulting signals from the primary APD and the secondary APD utilizing MIMO processing with Maximum Gain Ratio Combining to capture two pulses (events) in close proximity. (step 814)

Amplifying the results of step 814 with a trans-impedance amplifier. (step 816)

Detecting and outputting the multi-return signal including one or more hidden pulses with a diversity enhanced optical detector 620. (step 818)

D. Embodiments for Redundancy

As previously discussed, the performance of light detection of a multi-return light signal may be improved with the inclusions of a secondary APD that operates redundantly to a primary APD. The performance may be further improved with the inclusion of time diversity, e.g., where the bias signal to the secondary APD is delayed relative to the primary APD. The performance may be further improved with the inclusion of space diversity of the optical planes of the primary APD and the secondary APD. With space diversity, the output of the secondary APD may to attenuated, which may minimizes the possibility of the secondary APD saturating and entering a reverse bias recovery period. This may allow the secondary APD to detect hidden pulses.

Various configurations for the secondary and primary APDs may have further performance improvements. Example embodiments include, but without limitations, 1 secondary APD for 1 primary APD, 1 secondary APD for n primary APDs and m secondary APDs for n primary APDs. In other words, multiple redundant APDs may be utilized with different combinations of primary APDs. The secondary and primary APDs may operate in a static environment or in a dynamic environment. As described herein, light detector 600 may operates on a static basis. For a static environment, the operation of the redundant APDs and primary APDs may be pre-defined and may be independent of the characteristics of the multi-return light signals.

Dynamic solutions may be based on signal processing information of the multi-return light signals. Possible dynamic embodiments may include, but without limitations: 1) changing firing control order of primary APDs. This embodiment may include activating two or more primary APDs at a point in time; 2) dynamically adjusting the redundancy alignment of multiple secondary APDs and multiple primary APDs based on the positioning of the selected APDs on the optical focal plan; and 3) dynamically adjusting the delay bias signal coupled to the secondary APDs.

E. Summary

Embodiments of the present documents disclose systems and methods for mitigating APD blinding. A system may comprise a primary avalanche photodiode (APD) operable to receive and detect a multi-return light signal when activated by a first bias signal, wherein, the multi-return light signal comprises two or more light pulses; a secondary APD operable to receive and detect the multi-return light signal when activated by a second bias signal; a delay function that generates the second bias signal by adding a delay to the first bias signal; and a combiner operable to combine the multi-return light signal detected by the primary APD and the multi-return light signal detected by the secondary APD, wherein, if the primary APD saturates when detecting the multi-return light signal and is unable to detect a subsequent pulse, the secondary APD decodes the subsequent pulse. A method comprises receiving a multi-return light signal at a primary APD, wherein the multi-return light signal comprises a sequence of pulses that cause the primary APD to saturate and generate a detection blinding spot; receiving the multi-return light signal at a secondary APD, wherein the secondary APD operates redundantly to the primary APD; and detecting, by the secondary APD, pulses in the multi-return light signal that are hidden in the detection blinding spot of the primary APD and not detected by the primary APD. A system comprises two or more primary avalanche photodiodes (APDs), each operable to detect a multi-return light signal when activated by a first bias signal, wherein the multi-return light signal comprise two or more pulses; two or more secondary APDs, each operable to detect the multi-return light signal when activated by a second bias signal, wherein each of the two or more secondary APDs are operable to operate redundantly with each of the two or more primary APDS to perform the detection of the multi-return light signal; and a controller operable to select one of the two or more secondary APDs and one of the two or more primary APDs for detection of the multi-return light signal F. System Embodiments In embodiments, aspects of the present patent document may be directed to or implemented on information handling systems/computing systems. For purposes of this disclosure, a computing system may include any instrumentality or aggregate of instrumentalities operable to compute, calculate, determine, classify, process, transmit, receive, retrieve, originate, route, switch, store, display, communicate, manifest, detect, record, reproduce, handle, or utilize any form of information, intelligence, or data for business, scientific, control, or other purposes. For example, a computing system may be an optical measuring system such as a LIDAR system that uses time of flight to map objects within its environment. The computing system may include random access memory (RAM), one or more processing resources such as a central processing unit (CPU) or hardware or software control logic, ROM, and/or other types of memory. Additional components of the computing system may include one or more network or wireless ports for communicating with external devices as well as various input and output (I/O) devices, such as a keyboard, a mouse, touchscreen and/or a video display. The computing system may also include one or more buses operable to transmit communications between the various hardware components.

Figure 9:
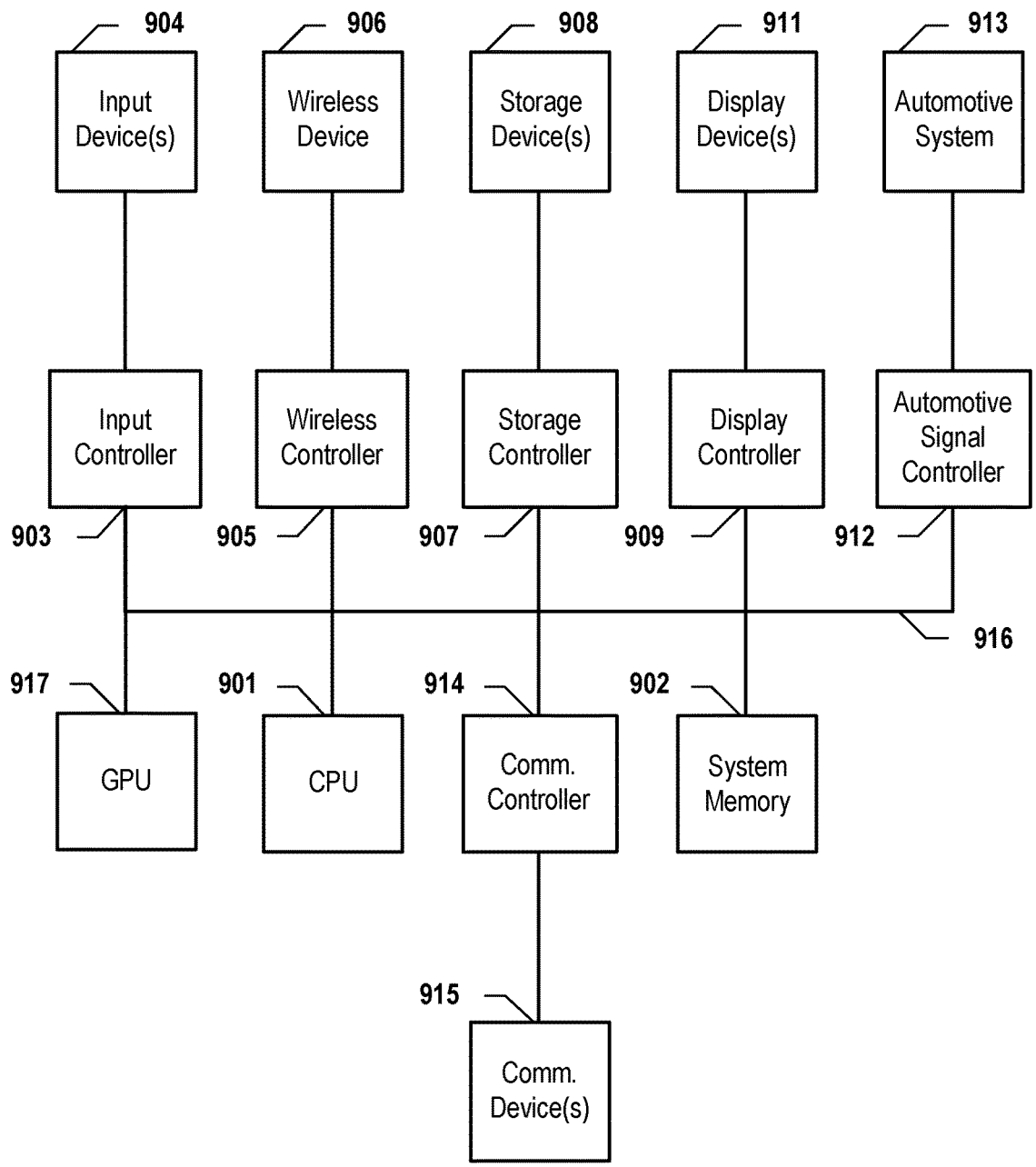
FIG. 9 depicts a simplified block diagram of a computing device/information handling system according to embodiments of the present document.

FIG. 9 depicts a simplified block diagram of a computing device/information handling system (or computing system) according to embodiments of the present document. It will be understood that the functionalities shown for system 900 may operate to support various embodiments of an information handling system—although it shall be understood that an information handling system may be differently configured and include different components.

As illustrated in FIG. 9, system 900 includes one or more central processing units (CPU) 901 that provides computing resources and controls the computer. CPU 901 may be implemented with a microprocessor or the like, and may also include one or more graphics processing units (GPU) 917 and/or a floating point coprocessor for mathematical computations. System 900 may also include a system memory 902, which may be in the form of random-access memory (RAM), read-only memory (ROM), or both.

A number of controllers and peripheral devices may also be provided, as shown in FIG. 9. An input controller 903 represents an interface to various input device(s) 904, such as a keyboard, mouse, or stylus. There may also be a wireless controller 905, which communicates with a wireless device 906. System 900 may also include a storage controller 907 for interfacing with one or more storage devices 908 each of which includes a storage medium such as flash memory, or an optical medium that might be used to record programs of instructions for operating systems, utilities, and applications, which may include embodiments of programs that implement various aspects of the present invention. Storage device(s) 908 may also be used to store processed data or data to be processed in accordance with the invention. System 900 may also include a display controller 909 for providing an interface to a display device 911. The computing system 900 may also include an automotive signal controller 912 for communicating with an automotive system 913. A communications controller 914 may interface with one or more communication devices 915, which enables system 900 to connect to remote devices through any of a variety of networks including an automotive network, the Internet, a cloud resource (e.g., an Ethernet cloud, an Fiber Channel over Ethernet (FCoE)/Data Center Bridging (DCB) cloud, etc.), a local area network (LAN), a wide area network (WAN), a storage area network (SAN) or through any suitable electromagnetic carrier signals including infrared signals.

In the illustrated system, all major system components may connect to a bus 916, which may represent more than one physical bus. However, various system components may or may not be in physical proximity to one another. For example, input data and/or output data may be remotely transmitted from one physical location to another. In addition, programs that implement various aspects of this invention may be accessed from a remote location (e.g., a server) over a network. Such data and/or programs may be conveyed through any of a variety of machine-readable medium including, but are not limited to: magnetic media such as hard disks, floppy disks, and magnetic tape; optical media such as CD-ROMs and holographic devices; magneto-optical media; and hardware devices that are specially configured to store or to store and execute program code, such as application specific integrated circuits (ASICs), programmable logic devices (PLDs), flash memory devices, and ROM and RAM devices.

Embodiments of the present invention may be encoded upon one or more non-transitory computer-readable media with instructions for one or more processors or processing units to cause steps to be performed. It shall be noted that the one or more non-transitory computer-readable media shall include volatile and non-volatile memory. It shall be noted that alternative implementations are possible, including a hardware implementation or a software/hardware implementation. Hardware-implemented functions may be realized using ASIC(s), programmable arrays, digital signal processing circuitry, or the like. Accordingly, the "means" terms in any claims are intended to cover both software and hardware implementations. Similarly, the term "computer-readable medium or media" as used herein includes software and/or hardware having a program of instructions embodied thereon, or a combination thereof. With these implementation alternatives in mind, it is to be understood that the figures and accompanying description provide the functional information one skilled in the art would require to write program code (i.e., software) and/or to fabricate circuits (i.e., hardware) to perform the processing required.

It shall be noted that embodiments of the present invention may further relate to computer products with a non-transitory, tangible computer-readable medium that have computer code thereon for performing various computer-implemented operations. The media and computer code may be those specially designed and constructed for the purposes of the present invention, or they may be of the kind known or available to those having skill in the relevant arts. Examples of tangible computer-readable media include, but are not limited to: magnetic media such as hard disks, floppy disks, and magnetic tape; optical media such as CD-ROMs and holographic devices; magneto-optical media; and hardware devices that are specially configured to store or to store and execute program code, such as application specific integrated circuits (ASICs), programmable logic devices (PLDs), flash memory devices, and ROM and RAM devices. Examples of computer code include machine code, such as produced by a compiler, and files containing higher level code that are executed by a computer using an interpreter. Embodiments of the present invention may be implemented in whole or in part as machine-executable instructions that may be in program modules that are executed by a processing device. Examples of program modules include libraries, programs, routines, objects, components, and data structures. In distributed computing environments, program modules may be physically located in settings that are local, remote, or both.

One skilled in the art will recognize no computing system or programming language is critical to the practice of the present invention. One skilled in the art will also recognize that a number of the elements described above may be physically and/or functionally separated into sub-modules or combined together.

It will be appreciated to those skilled in the art that the preceding examples and embodiments are exemplary and not limiting to the scope of the present disclosure. It is intended that all permutations, enhancements, equivalents, combinations, and improvements thereto that are apparent to those skilled in the art upon a reading of the specification and a study of the drawings are included within the true spirit and scope of the present disclosure. It shall also be noted that elements of any claims may be arranged differently including having multiple dependencies, configurations, and combinations.

What is claimed is:

1. A method comprising:
receiving a multi-return light signal comprising a plurality of light pulses at a first photodetector and at a second photodetector;
in response to receiving the multi-return light signal, generating, by the first and second photodetectors, respective first and second electrical signals, wherein the second electrical signal is attenuated, as compared to the first electrical signal;
combining the first and second electrical signals, thereby generating a combined signal; and
detecting the plurality of light pulses by decoding the combined signal.

2. The method of claim 1 further comprising:
activating, by a first bias signal, the first photodetector; and
activating, by a second bias signal, the second photodetector.

3. The method of claim 2, wherein the second bias signal is delayed with respect to the first bias signal.

4. The method of claim 3 further comprising:
generating the second bias signal by adding a delay to the first bias signal.

5. The method of claim 1, wherein the first photodetector and second photodetector are structured and arranged in a light detecting and ranging (LIDAR) system.

6. The method of claim 5 further comprising attenuating the second electrical signal by attenuating, using a gain setting of the second photodetector, a first amount of optical power of the multi-return light signal received at the second photodetector relative to a second amount of optical power of the multi-return light signal received at the first photodetector.

7. The method of claim 1, wherein the second electrical signal is attenuated by positioning the second photodetector on a different optical path than the first photodetector.

8. The method of claim 1, wherein the attenuating prevents saturation of the second photodetector under one or more conditions in which the first photodetector saturates.

9. The method of claim 5, wherein the attenuating comprises positioning the second photodetector off a main focal plane of a receiver of the LIDAR system and positioning the first photodetector on a main focal plane of the receiver.

10. The method of claim 1, wherein the second photodetector operates redundantly of the first photodetector.

11. The method of claim 1, wherein the first photodetector comprises a first avalanche photodiode (APD), and the second photodetector comprises a second avalanche photodiode (APD).

12. A system comprising:
a combiner device structured and arranged to generate a combined signal by combining (1) a first electrical signal generated by a first photodetector in response to the first photodetector receiving a multi-return light signal; and (2) a second electrical signal generated by a second photodetector in response to the second photodetector receiving the multi-return light signal, wherein the multi-return light signal comprises two or more light pulses;
a current amplifier, configured to amplify the second electrical signal generated by the second photodetector and coupled to the combiner device; and
a receiver device configured to detect the two or more light pulses by decoding the combined signal.

13. The system of claim 12 further comprising the first photodetector and the second photodetector.

14. The system of claim 12 further comprising a gain controller adapted to control the current amplifier based on an output current of the second photodetector and an output current of the first photodetector.

15. The system of claim 12 further comprising a delay component structured and arranged to generate a second bias signal adapted to activate second photodetector by adding a delay to a first bias signal adapted to activate the first photodetector.

16. The system of claim 15 further comprising a range gate control operable to control the delay component.

17. The system of claim 12, wherein the receiver device comprises a trans-impedance amplifier electrically coupled to an output of the combiner device and to an input of a diversity enhanced optical detector.

18. The system of claim 12, wherein the combiner device is structured and arranged to implement MIMO processing with maximum gain ratio combining.

19. The system of claim 12, wherein the first photodetector comprises a first avalanche photodiode (APD), and the second photodetector comprises a second avalanche photodiode (APD).

20. A method comprising:
activating, by a first bias signal, a first photodetector selected from two or more first photodetectors;
activating, by a second bias signal, a second photodetector;
receiving, by the selected and activated first photodetector and by the activated second photodetector, a multi-return light signal comprising a plurality of light pulses;
amplifying, by a current amplifier, the multi-return light signal of the activated second photodetector; and
combining the multi-return light signal of the first photodetector and the second photodetector.

21. The method of claim 20, wherein the first photodetector comprises a first avalanche photodiode (APD), and the second photodetector comprises a second avalanche photodiode (APD).

22. The method of claim 20, wherein the second photodetector is configured to attenuate the multi-return signal.

* * * * *